United States Patent [19]
Sponholz et al.

[11] 3,824,481
[45] July 16, 1974

[54] CIRCUIT ARRANGEMENT FOR AUTOMATIC ZERO LEVEL COMPENSATION

[75] Inventors: Richard Sponholz, Muhlhofen; Hans Kiefer, Dubdorf, both of Germany

[73] Assignee: Bodenscewerk Perkin-Elmer & Co., GmbH, Uberlingen Bodensee, Germany

[22] Filed: Feb. 7, 1973

[21] Appl. No.: 330,222

[30] Foreign Application Priority Data
Feb. 8, 1972 Germany............................ 2205792

[52] U.S. Cl..... 328/162, 178/7.3 DC, 178/DIG. 26, 328/173, 330/11
[51] Int. Cl............................................. H04b 1/12
[58] Field of Search........... 328/150, 162, 163, 173, 328/175; 330/11 SZ; 178/7.3 DC, 7.5 DC, 7.1, DIG. 26, DIG. 12

[56] References Cited

UNITED STATES PATENTS 3,550,018 12/1970 James et al........................ 328/127

*Primary Examiner*—John Zazworsky
*Attorney, Agent, or Firm*—Daniel R. Levinson

[57] ABSTRACT

A known type of circuit for compensating (i.e. balancing or zeroing) an input signal relative to a changing base line includes a voltage-to-frequency converter receiving the input signal being compensated or balanced, a counter receiving the output pulses of this voltage-to-frequency converter, and a digital-to-analog converter controlled by the counter, where the output of the digital-to-analog converter generates a correction signal which can be added algebraically to the input signal for zero level (base line) compensating or balancing. To shorten the time of balancing without causing overshooting, the present circuit causes coarse adjustment by feeding the output of a (relatively high) fixed frequency generator to the more significant counting stages of the counter until an approximation of balance is reached, followed by feeding the output of the conventional voltage-to-frequency converter to the lesser significant stages after this coarse balancing has been completed. The means for changing over from the coarse balancing to the fine adjustment may include a positive and a negative threshold-value switch.

2 Claims, 1 Drawing Figure

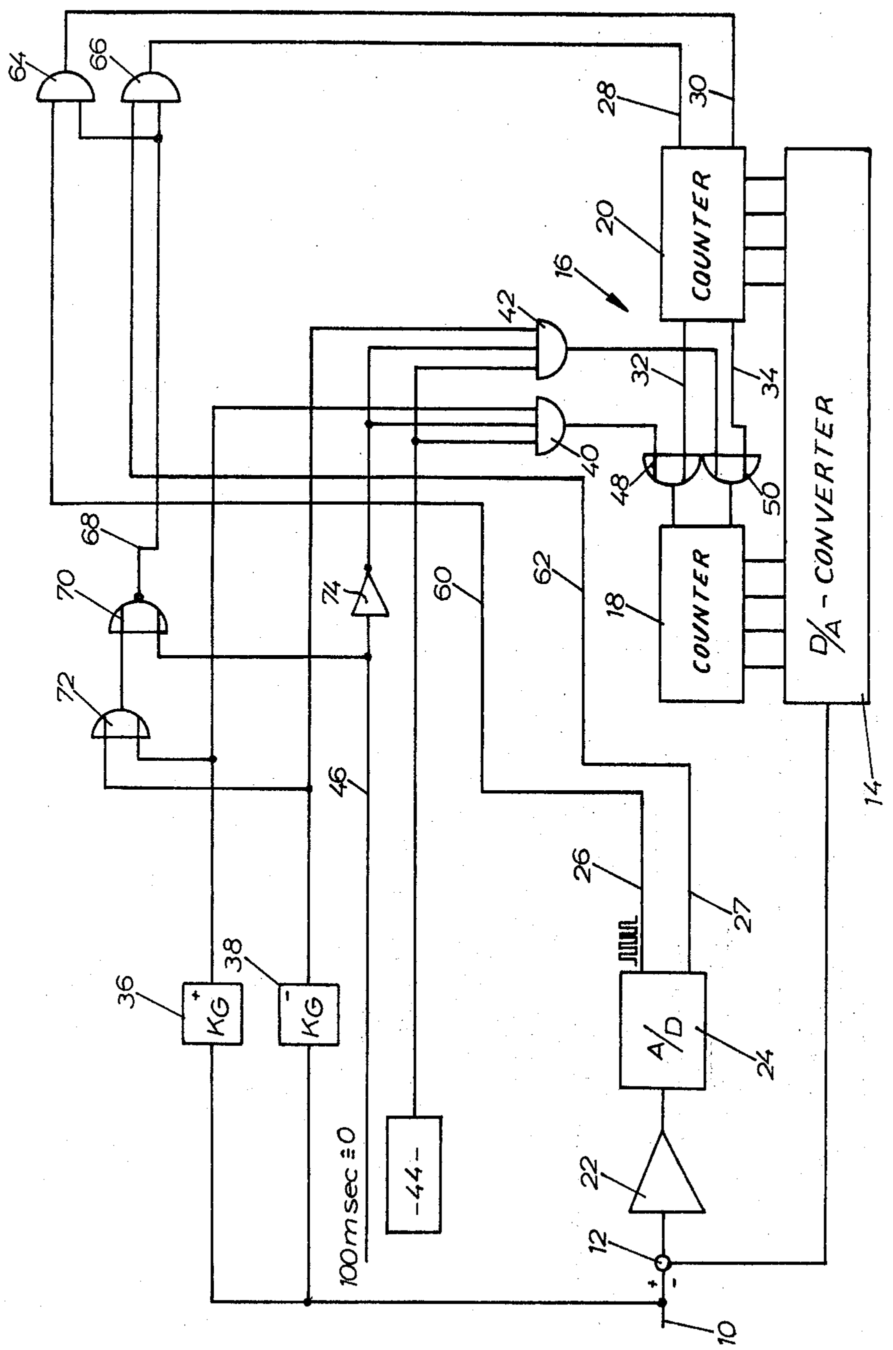
COUNTER
COUNTER
D/A - CONVERTER
A/D
KG
KG
100 m sec = 0
-44-

CIRCUIT ARRANGEMENT FOR AUTOMATIC ZERO LEVEL COMPENSATION

This invention relates to a circuit arrangement for automatic zero line balancing (i.e., compensation of a signal relative to its true zero level, when the apparent zero level or base line may be changing because of drift). One type of such circuit comprises a voltage-to-frequency converter to which is applied the input or measuring signal being balanced, (which contains at this time only a base line drift component) a counter into which the output pulses of the voltage-to-frequency converter can be counted, and a digital-to-analog converter controlled by the counter, which converter generates a correction signal analogous to the counter reading, which correction signal can be algebraically added to the input signal for zero line balancing (i.e., causing this input signal level to be compensated to the desired or true zero level).

Prior circuit arrangements of the type indicated suffer from the shortcoming that the zero line balancing requires a relatively long time, because the output frequency of the analog-to-digital (voltage-to-frequency) converter becomes increasingly smaller with decreasing measuring signal and consequently, the zero line balancing is effected increasingly more slowly. This leads to balancing times which are too long for some applications.

As disclosed in United States Letters Patents Nos. 3,634,770 and 3,754,232, both assigned to the assignee of the instant application, such zero line balancing or compensating (also referred to as base line compensating) is typically used to compensate the input signal for base line drift between actual peak signals which are to be measured. In particular, in FIG. 1 of U.S. Pat. No. 3,754,232, the base line compensation is accomplished by all the elements other than 13 and 15 in a manner substantially identical to the way just described.

In one recent prior art circuit arrangement instead of an analog-to-digital converter which supplies a counting pulse frequency dependent on the zero line drift, there is provided a pulse generator operating with a fixed frequency. The counting of pulses from the pulse generator into the counter is controlled by a threshold-value switch, switching the counting pulses to the counter as long as there is a zero line drift above a specific small threshold value. Though this prior art arrangement offers the advantage that balancing can be effected more quickly when the generator frequency is selected high enough, however, due to the inertia of the electronic component parts there is the danger of overshoot in such high-speed digital operation. Circuits of the type just mentioned are shown, for example, in FIG. 2 (excluding elements 20, 22 and 24) of U.S. Pat. No. 3,634,770 where the pulse generator is connected at 68, and in FIG. 2 of U.S. Pat. No. 3,754,232 where the pulse generator is shown at 44.

It is an object of this invention to so devise a circuit arrangement of the type mentioned hereinbefore that on the one hand zero line balancing can be effected in the required short time, while on the other hand the danger of overshooting of zero line correction in the opposite direction (polarity) is avoided. According to the invention this object is attained by providing that the counter has two groups of counter stages and that pulses of a fixed frequency can be counted into the group of counter stages corresponding to the higher-weighted digits (i.e., more significant bits), as long as the zero line drift exceeds a given threshold value, and that after the zero line drift falls below this threshold value the fixed frequency can be switched off and the output of the voltage-to-frequency converter can be fed to the group of counter stages corresponding to the lower-weighted digits (i.e., less significant bits).

Thus, according to this invention, the counter is divided. A fixed frequency is counted into a first group of counter stages corresponding to the higher (more significant) digits. Thereby, a coarse balancing of the zero line to within a particular fixed threshold value is obtained. This coarse balancing is effected relatively quickly. When the coarse balancing has been accomplished, then pulses of a frequency dependent on the actually measured zero line drift will be counted into the group of counter stages corresponding to the lower (less significant) digits. The zero line is then balanced continuously and without overshooting precisely to zero. As this fine correction only has to compensate an amplitude corresponding to no more than the threshold value, this fine correction is done in a relatively short time.

An illustrative embodiment of this invention will now be described more fully with reference to the sole FIGURE in the accompanying drawing showing a circuit arrangement in diagrammatic form according to the invention.

A measuring signal (i.e., the signal which is to be compensated to its base or zero line) is applied to an input 10. A correction signal from a digital-to-analog converter 14 is super-imposed on the measuring signal as at 12. The digital-to-analog converter is controlled by a counter 16 comprised of two groups of counter stages 18 and 20, the group of counter stages 18 corresponding to the higher-weighted digits (more significant bits) and the group of counter stages 20 corresponding to the lower-weighted digits (less significant bits). The digital-to-analog converter generates a signal analogous (i.e., proportional) to the counter reading, which is algebraically added to the measuring signal for zero line correction. The corrected measuring signal is supplied to an analog-to-digital converter 24 via amplifier 22. The analog-to-digital converter 24 is a voltage-to-frequency converter which supplies at its outputs 26 or 27 depending on the polarity of this input voltage, a pulse sequence of a frequency proportional to the input voltage. This frequency is applied to the up or down input 28, 30, respectively, of the group of counter stages 20, that is, the counter stages with the lower-weighted digits (less significant bits), via AND-gate circuits to be described hereinafter. From the group of counter stages 20 a transfer to the group of counter stages 18 corresponding to the higher-weighted digits (more significant bits) is effected in a conventional manner via lines 32 or 34 respectively. In particular, one type of change of state of the highest or most significant stage of the (less significant) counter 20 will cause a corresponding change of state in the lowest or least significant stage of the (more significant) counter 18, since the most significant stage of counter 20 is "weighted" one digit "lower" in value than the least significant stage of counter 18 (i.e., counters 20 and 18 together effectively comprise the various stages of a continuous digital counter, separated into two groups of more significant and less significant stages by leads 32 and 34 and OR-gates 48 and 50, hereinafter described).

The input of the analog-to-digital converter 24 is connected to two threshold value switches 36, 38 for coarse balancing, the threshold value switch 36 responding (changing to a "high" condition) at a particular threshold value of positive polarity and the threshold value switch 38 responding at the same threshold value but of negative polarity. The threshold value switches 36, 38, respectively, have their outputs connected to the inputs of one AND-element each, namely, 40 and 42, respectively. To another input of each of the two AND-gates 40 and 42 is connected a frequency generator 44, supplying pulses at a fixed (relatively high) frequency. At the beginning of each balancing interval a "low" pulse of a duration of, say, 100 milliseconds appears on a line 46. This pulse is also applied (as inverted at 74) to the two AND-elements 40 and 42. The outputs of the AND-elements 40 and 42 act on the up and down inputs, respectively, of the group of counter stages 18 via OR-gates 48, 50, another input of which is fed by the transfer leads 32, 34.

The outputs 26, 27 of the analog-to-digital converter 24 connect to one input of respective AND-elements 64, 66, respectively, via leads 60, 62. The other inputs of these AND-elements are controlled by an OR-gate having inversion of the output (i.e., a NOR-gate) 70 via lead 68. To one input of this gate 70 the output of an OR-gate 72 is applied, whose inputs are connected to the outputs of the two threshold value switches 36 and 38. To the second input of the NOR-gate 70 is connected lead 46 having the "low" 100 millisecond-signal which is also applied to the AND-elements 40 and 42 via an inverter stage 74. The outputs of the two AND-elements 64 and 66 are connected to the respective up and down inputs 28, 30 of the less significant group of counter stages 20.

The operation of the arrangement hereinbefore described is as follows. With a positive zero line drift exceeding or equal to the threshold value for the coarse balancing, the threshold value switch 36 responds. At the output of the OR-gate 72 an 1 (or high) signal appears. At the inverted output of the NOR-gate 70 a 0 (or low) signal appears. Via the lead 68 therefore the AND-gates 64 and 66 are blocked. Thus, the pulses from the analog-to-digital converter 24 are not counted into the less significant group of counter stages 20. Instead, the AND-element 40 obtains an 1 (high) signal at an input from the threshold value switch 36. During a period of time of 100 milliseconds that lead carries a 0 (or low) signal, it also obtains an 1 (high) signal via the line 46 and the inverter stage 74, so that pulses from the pulse generator 44 via the AND-gate 40 are counted into the group of counter stages 18 via the OR-gate 48.

If the zero line drift falls below the threshold value for the coarse balancing or after expiration of 100 milliseconds (whichever occurs first), the AND-gate 40 will be blocked. If the zero line drift falls below the threshold for the coarse balancing within the given balancing time of 100 milliseconds, then an 1 signal appears on the line 68 (since both of the inputs to NOR-gate 70 are 0 or low) so that the AND-gates 64 and 66 will be opened. Under such circumstances, pulses from the analog-to-digital converter 24 are counted into the one or other of the inputs 28 or 30 of the group of counter stages 20, specifically from one of the outputs 26 or 27 either through lead 60 or through lead 62. The frequency of the pulses decreases continuously upon approximation (i.e., approach) to the state of balance so that overshooting beyond the state of balancing is avoided, while "balancing" the zero line (i.e., compensating the input or measured signal to a base line shift) is accomplished within a 100 millisecond interval.

We claim:

1. In a circuit for automatic balancing or compensating of an input signal to a drifting zero base line level including in series relationship a voltage-to-frequency converter to the input of which is applied the input signal being balanced, a counter for counting the output pulses of the voltage-to-frequency converter, and a digital-to-analog converter controlled by the counter, which generates an analog correction signal proportional to the counter reading, which correction signal is algebraically added to the input signal for base line level balancing, the improvement comprising:

that the counter comprises two distinct groups of counter stages, one of said groups consisting of the more significant bit stages and the other of said groups consisting of the less significant bit stages;

a fixed frequency pulse generator, the output of which is connected through a first controllable means to said one group of more significant bit counter stages;

said first controllable means passing the output from said fixed frequency pulse generator to said one group of more significant bit counter stages only when said input signal differs from the desired zero base line level by more than a particular threshold value;

The output of said voltage-to-frequency converter being connected through a second controllable means to said other group of less significant bit counter stages, said second controllable means passing the output of said voltage-to-frequency converter to said other group of less significant bit counter stages only when said input signal has been compensated relative to said desired zero base line level to within said particular threshold value, whereby coarse compensating of said input signal to said desired zero base level is obtained rapidly by the fixed frequency pulses causing the one group of more significant counter stages to store a value proportional to an approximate correction signal to within said threshold value, and then fine compensating of said input signal to said desired zero base line level is obtained from the voltage-to-frequency converter causing said other group of less significant counter stages to be driven at decreasing rate as the partially compensated input signal approaches closer and closer to the desired zero base level, so that rapid balancing of the input signal relative to the desired zero base line level is obtained, but without any overshooting of the desired compensation.

2. A compensating circuit according to claim 1, in which:

said first and second controllable means comprises first and second gating means;

and a threshold-value determining means continuously detects whether the input signal as partially compensated differs from said desired zero base line level by more or less than said particular threshold value, said determining means being operatively connected to said first and second controllable means so as to control said first and second gating means, whereby said first gating means passes pulses only when said particular threshold value is exceeded by, and said second gating means passes pulses only when said particular threshold value is larger than, the difference between said partially compensated input signal and said desired zero base line level.

* * * * *